US006994544B2

(12) United States Patent
Aldridge et al.

(10) Patent No.: US 6,994,544 B2
(45) Date of Patent: Feb. 7, 2006

(54) WAFER SCALE THERMAL STRESS FIXTURE AND METHOD

(75) Inventors: David M. Aldridge, Tucson, AZ (US); Lonnie D. Mitchell, Tucson, AZ (US); Joseph L. Roedig, Chandler, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 68 days.

(21) Appl. No.: 10/769,093

(22) Filed: Jan. 30, 2004

(65) Prior Publication Data

US 2005/0167899 A1 Aug. 4, 2005

(51) Int. Cl.
*F27D 5/00* (2006.01)

(52) U.S. Cl. ...................... 432/247; 432/253; 118/725; 118/728

(58) Field of Classification Search ................. 432/81, 432/159, 247, 249, 253, 254.1; 118/715, 118/725, 728; 438/795, 799; 414/935; 29/446, 29/448

See application file for complete search history.

(56) References Cited

U.S. PATENT DOCUMENTS

| | | | | |
|---|---|---|---|---|
| 5,885,353 A * | 3/1999 | Strodtbeck et al. | ......... | 118/712 |
| 5,906,683 A * | 5/1999 | Chen et al. | ................. | 118/724 |
| 6,416,318 B1 * | 7/2002 | Lee et al. | ................... | 432/247 |
| 6,444,037 B1 * | 9/2002 | Frankel et al. | .............. | 118/715 |
| 6,884,066 B2 * | 4/2005 | Nguyen et al. | ............. | 432/250 |

* cited by examiner

*Primary Examiner*—Gregory Wilson
(74) *Attorney, Agent, or Firm*—W. Daniel Swayze, Jr.; W. James Brady; Frederick J. Telecky, Jr.

(57) ABSTRACT

A fixture for supporting a plurality of semiconductor chips during the thermal cycling of the chips, including a fluid-permeable bottom screen, a chip-cavity-defining plate supported against a top surface of the bottom screen, a lower attaching mechanism for attaching the chip-cavity-defining plate to the top surface of the bottom screen, and a removable fluid-permeable top screen attached to a top surface of the chip-cavity-defining plate to cover the plurality of holes and chips therein.

24 Claims, 3 Drawing Sheets

WAFER SCALE THERMAL STRESS FIXTURE AND METHOD

BACKGROUND OF THE INVENTION

The present invention relates generally to carriers for chip-scale devices, also referred to as wafer scale packaging (WSP) devices or as WSP chips, and also relates to techniques for rapid, efficient thermal testing and/or thermal cycling of WSP chips.

Thermal testing and/or cycling of a batch of WSP chips ordinarily is accomplished by placing a large number of WSP chips in a conventional plastic carrier, placing the carrier in a thermal chamber, and either heating the chamber and/or passing a heated gas or liquid medium through the chamber. For temperature cycling, typically the carrier and the WSP chips therein are alternately subjected to "hot baths" and "cold baths" of gas or liquid medium to provide rapid thermal ramp-up times and thermal ramp-down times. A typical liquid used for this purpose is "FLUORINERT", which is commercially available from 3M Corporation. A typical inert gas used as a thermal medium is nitrogen.

One prior art chip carrier, part number H20-130-2462-C02 available from Entregris Corporation, is shown in FIG. 1.

The Entregris chip carrier product of FIG. 1 has the shortcoming that it does not allow fluid thermal medium to flow through the carrier and come in direct contact with the chips being carried. The Entregris chip carrier therefore has very long thermal ramp-up and ramp-down times, which adds substantially to the cost of thermal stress cycling procedures. Typically, five-minute temperature ramping times or less are desirable in thermal cycling, between, for example, −55 degrees Celsius (C.°) to +125 C.° or even as high as +150 C.°. Another shortcoming of the Entregris chip carrier product of FIG. 1 is that the plastic material, which is manufactured under the trade mark FLUOROWARE, does not tolerate high temperatures. Another shortcoming is that the plastic material out-gases at temperatures slightly above room temperature, which may deleteriously affect the performance of chips in the carrier. The plastic is composed of carbon-impregnated petro-chemical materials, and the plastic usually is coated by a layer of anti-static material. Consequently, heating the plastic carrier results in release of free ionic gases. The out-gassing tends to cause electronic charge and plastic residues to be deposited on the chip surfaces. This often causes errors in circuit operation of the chips, resulting in loss of the chips during functional testing thereof.

Other conventional chip carriers typically are also made of plastic material. None of the unknown chip carriers are well-suited for supporting WSP chips during the thermal testing and/or thermal cycling that usually is a requirement for a semiconductor manufacturer to meet the "qualification" standards for each product that most large customers require to be met before they will purchase the product.

There are additional reasons that cause conventional fixturing mechanisms and devices, such as the above described Entregris chip carrier, to be unsuitable for performing thermal stress test sequences and thermal cycling on small devices such as WSP chips. Presently available fixturing mechanisms such as chip support trays do not adequately support WSP chips under test, and do not allow proper flow of gas or liquid thermal mediums around the WSP chips to be thermally tested or thermally cycled.

Also, the thermal mass of the prior art chip support fixturing devices or trays is so large that it greatly reduces the rate at which the WSP chips attain the desired temperatures. This has prevented the desired amount of thermal shock specified by the above-mentioned qualification standards from being applied to the WSP chips, because most of the thermal energy from the thermal medium is being transferred between the thermal medium and the prior art carriers, rather than between the thermal medium and the chips. Furthermore, most of the thermal energy involved in the thermal cycling, has been wasted.

Also, the prior art plastic chip carriers tend to warp or be physically deformed due to mismatches in temperature expansion coefficients of the materials, and the resulting stretching, flexing, etc. of the materials when subjected to increased temperatures may interfere with the ability of the carriers to adequately hold the WSP chips, and may displace them from the carrier cavities in which the WSP chips are intended to be supported. Such displacement of a WSP chip may result in damage to it while it is in a thermal testing or thermal cycling chamber. The damage may include chipping of edges of the chip and/or damage to the chip metallization (especially to solder bumps that are used for external electrical contact to the chip metallization), causing rejection and loss of the chip at the functional testing stage.

Thus, there is an unmet need for a fixturing mechanism capable of reliably containing and supporting WSP chips and like to be tested, wherein the fixturing mechanism allows a thermal gas or liquid medium to readily and uniformly flow around the WSP chips under test.

There also is an unmet need for a thermal stress fixture that does not damage WSP chips therein.

There also is an unmet need for a thermal stress fixture that allows fast temperature ramp-up and fast temperature ramp-down during thermal stress cycling.

There also is an unmet need for a thermal stress fixture that avoids waste of thermal energy during thermal stress testing and/or thermal cycling.

There also is an unmet need for a thermal stress fixture that avoids damage to semiconductor chips due to out-gassing of substances from materials of which the thermal stress fixture is composed.

SUMMARY OF THE INVENTION

Accordingly, is an object of the invention to provide a fixturing mechanism and method that are capable of reliably containing and supporting WSP chips and like to be tested that also allow a thermal gas or liquid medium to directly contact the WSP chips under test and readily and uniformly flow around the WSP chips under test.

It is another object of the invention to provide a thermal stress fixture that does not damage WSP chips therein.

It is another object of invention to provide a thermal stress fixture that allows fast temperature ramp-up and fast temperature ramp-down during thermal stress cycling.

It is another object of the invention to provide a thermal stress fixture that avoids waste of thermal energy during thermal stress testing and/or thermal cycling of semiconductor chips.

It is another object of invention to provide a thermal stress fixture that avoids damage to semiconductor chips due to out-gassing of substances from materials of which the thermal stress fixture is composed.

Briefly described, and in accordance with one embodiment, the present invention provides a fixture for supporting a plurality of semiconductor chips during the thermal stressing and/or cycling of the chips, including a gas-permeable and liquid-permeable bottom screen, a chip-cavity-defining plate supported against a top surface of the bottom screen, a lower attaching mechanism for attaching the chip-cavity-defining plate to the top surface of the bottom screen, and a removable gas-permeable and liquid-permeable top screen attached to a top surface of the chip-cavity-defining plate to cover the plurality of holes and chips therein. In the described embodiment, the fixture (100) includes a fluid-permeable bottom screen (20), a chip-cavity-defining plate (22) disposed against a top surface of the bottom screen (20), the chip-cavity-defining plate having a plurality of holes (24) therein, a fluid-permeable top screen (40), and a removable mounting flange (30) attached to a bottom surface of the top screen (40) for holding the top screen against a top surface of the chip-cavity-defining-plate (22) to cover the plurality of holes (24) and chips (10) therein. The top screen, bottom screen and the plurality of holes in the chip-cavity-defining plate form a plurality of cavities for containing a plurality of semiconductor chips, respectively. In the described embodiment, a bottom surface of the chip-cavity-defining plate (22) is adhesively attached to the top surface of the bottom screen (20), and a top surface of the mounting flange is adhesively attached to a bottom surface of the top screen. The top screen and bottom screen are composed of pre-tensioned stainless deal screen mesh.

According to the method of the invention, the semiconductor chips (10) are thermally cycled by supporting them in a the fixture, wherein the fixture has very low thermal mass. The semiconductor chips (10) are placed in various cavities (24) defined by the holes (24) in the bottom screen (20) and the chip-cavity-defining plate, and a subassembly including the top screen (40) and the chip-cavity-defining plate (22) is placed on a subassembly including the bottom plate and the chip-cavity-defining plate to cover the cavities (24) and the chips (10) therein. The fixture (100) with the chips (10) therein is placed in a thermal cycling device (50). The semiconductor chips are thermally stressed and/or thermally cycled by passing a fluid thermal medium of a predetermined temperature through the top screen (40), around the semiconductor chips (10), and through the bottom screen (20).

A plurality of fixtures (100) are made by adhesively attaching bottom surfaces of a plurality of chip-cavity-defining plates (22) to a surface of taut pre-tensioned fluid-permeable screen material stretched over a tensioning frame to form a plurality of bottom subassemblies having chip cavities into the which semiconductor chips can be placed. The top surfaces of a plurality of mounting flanges (30) are adhesively attached to a surface of the taut pre-tensioned fluid-permeable screen material to form a plurality of top subassemblies which can be aligned with and attached to the bottom subassemblies, respectively, to provide covers over the cavities and semiconductor chips therein during the thermal cycling.

BRIEF DESCRIPTION OF THE DRAWINGS

FIG. 1 is an exploded view of prior art fixture for supporting a batch of WSP chips or the like.

DETAILED DESCRIPTION OF THE PREFERRED EMBODIMENTS

Figure 2A:
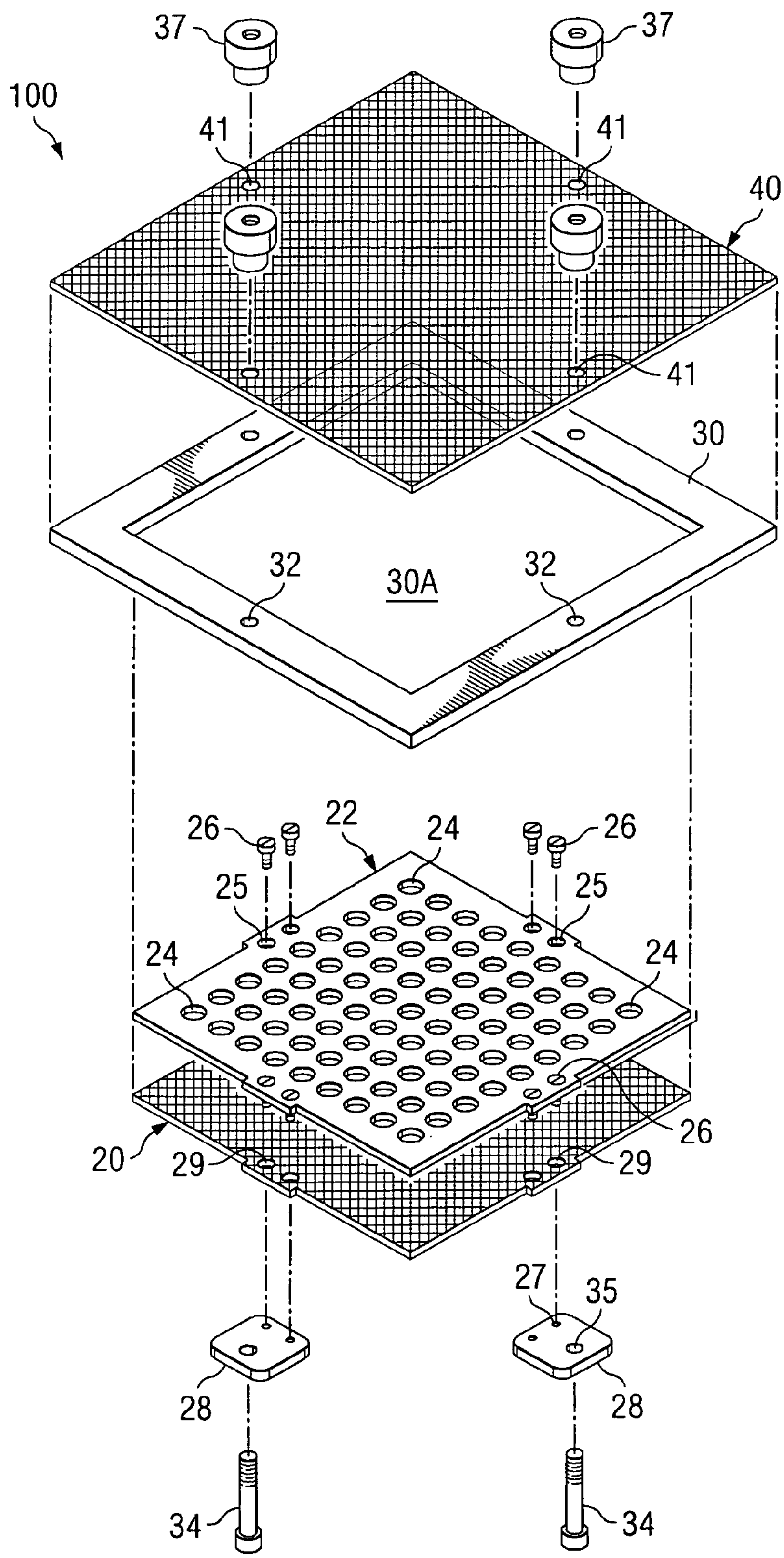
FIG. 2A is a three-dimensional exploded view of a WSP thermal stress fixture of the present invention.

Referring to the exploded view of FIG. 2A, WSP thermal stress fixture 100 of the present invention includes a generally rectangular fine mesh stainless steel bottom screen 20 which functions as the bottom of fixture 100. Stainless steel bottom screen 20 can be composed of stainless steel pre-tensioned mesh. In the described embodiment, screen 20 is composed of stainless steel screen material manufactured according to specification number SS 101-10, available from Microscreen, Inc. of South Bend, Ind. A generally rectangular tray 22 having an array of WSP chip cavities 24 therein is disposed on the upper surface of bottom screen 20. Each chip cavity 24 is in the form of a round hole that extends to bottom screen 22, which forms a bottom of each chip cavity 24. Tray 22 can be composed of 6061-T6 or equivalent of aluminum material, and can have a thickness of 40 mils (millimeters). Alternatively, the chip cavities 24 can be elliptical or rectangular.

Tray 22 includes a pair of clearance openings 25 along each of its four edges, and a pair of screws 26 extends through the clearance holes 25, respectively, and through corresponding clearance holes 29 through bottom screen 20 which are respectively aligned with clearance holes 25 of tray 22. The threaded portions of screws 26 engage threaded holes 27 in four tabs 28 located on the bottom surface of bottom screen 20. Screws 26 thus hold tray 22 against the upper surface of bottom screen 20.

A generally rectangular mounting flange 30 is disposed around the upper edge surfaces of tray 22. Mounting flange 30 can be composed of the same aluminum material as tray 22 and can have the same thickness as tray 22. A generally rectangular top screen 40 composed of the same stainless steel mesh as bottom screen 20 is disposed on the upper surface of frame 30. A clearance hole 32 extends through the central portion of each side of frame 30. Four screws 34 extend upward through a hole 35 in each of the four tabs 28, through the four holes 32 of frame 30, respectively, and through corresponding holes 41 in the edges of top screen 40. Four knurled nuts 37 engage the threads of screws 34 and draw top screen 40 and frame 30 against the subassembly including tray 22 and bottom screen 20.

Figure 2B:
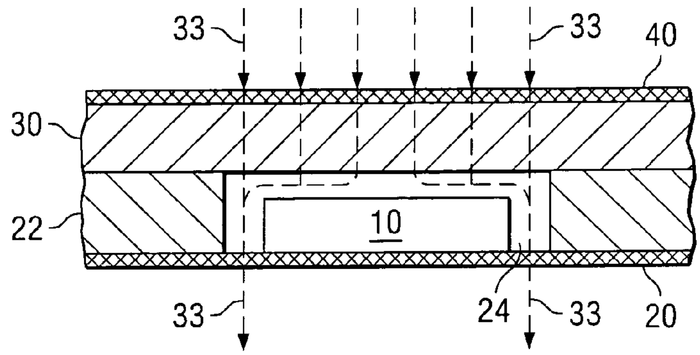
FIG. 2B is an enlarged three-dimensional sections view of a portion of the WSP fixture of FIG. 2A showing a WSP chip within a cavity of the fixture and also showing a flow path of thermal fluid medium through the fixture and directly contacting the WSP chip.

FIG. 2B shows a section view of the fixture 100, including one of the cavities 24 and a chip 10 loosely placed in cavity 24 of tray 22. Chip 10 rests on the top surface of bottom screen 20. However, the top surface of chip 10 does not touch the bottom surface of top screen 40. A top subassembly 30,40 composed of top screen 40 and mounting flange 30 is tightly held by screws 34 and nuts 37 against the bottom subassembly 20,22 composed of bottom screen 20 and tray 22 so that the bottom surface of mounting flange 30 is pressed against the upper surface of bottom screen 20. Arrows 33 show the flow paths of gas thermal medium which rapidly ramps the WSP chip up to the desired thermal stress temperature and later rapidly ramps the WSP chip down to the desired lower thermal stress temperature.

The above-mentioned stainless steel screen material is shipped by the manufacturer tightly pre-tensioned over a tensioning frame. To construct the bottom subassembly 20,22, a suitable glue or adhesive, such as EPOTEK B9114-2 glue, is applied to the bottom surface of the trays 22, which are then placed on the taut screen material while it is still tightly stretched on the tensioning frame. After curing for 24 hours at +25 degrees Celsius followed by 2 hours at +150 degrees Celsius followed by 30 minutes at +200 and degrees Celsius, the screen material is cut along the edges of the trays 22, and the four tabs 28 are attached to the bottom edges of each bottom subassembly 20,22 by means of small screws 26 extending through clearance holes 25 of tray 22 into threaded holds 27 in tabs 27. Four screws 34 are threaded through holes 35 in the four tabs 28 and extend upward alongside the outer edges of the tray 22 to complete bottom subassembly 20,22. Alternatively, however, clips could be used instead of all the above mentioned screws, and other adhesive material, such as latex rubber compound, could be used instead of glue.

Similarly, the top subassembly 30,40 is formed by applying the adhesive to the top surfaces of a number of frames 30 and placing them on the taut framed screen material. After curing, the top screen 40 of each top subassembly 30,40 is cut along the outer edges of its mounting flange 30. Using a vacuum pencil (not shown), individual WSP chips can (FIG. 2B) are loaded into the various cavities 24 of bottom subassembly 20,22. Top subassembly 30,40 is then placed so that the four screws 34 are aligned with the clearance holes 32 and 41. Top subassembly 30,40 then is lowered onto bottom subassembly 20,22 and the nuts 37 are threaded on to the portions of screws 34 extending above the top screen 40 and tightened. After the thermal cycling process, the top subassemblies 30,40 are removed, and the WSP chips are removed from the chip cavities 24.

Figure 3:
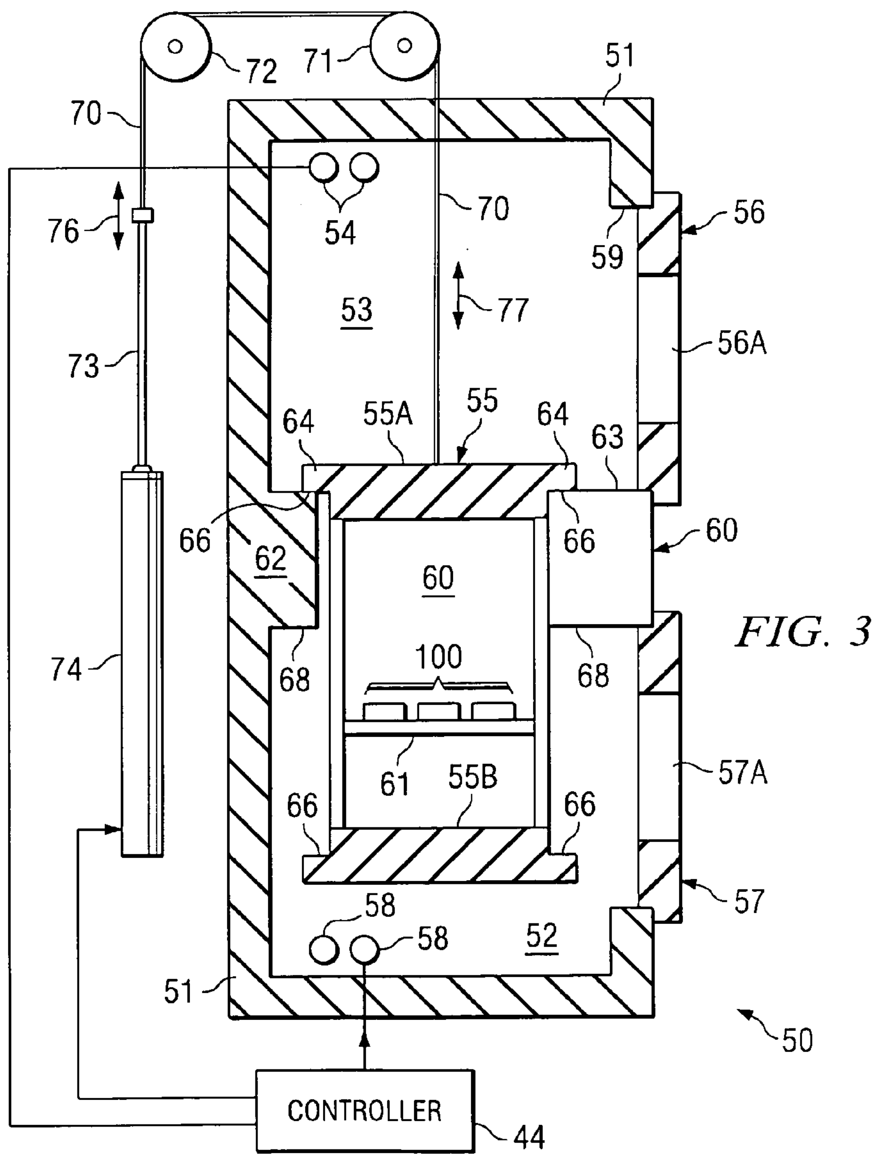
FIG. 3 is a generalized diagram of a thermal testing chamber containing a plurality of loaded WSP fixtures of FIG. 2A, and also showing flow of thermal fluid medium through the WSP fixtures.

FIG. 3 is a diagram of a thermal stress chamber 50. Thermal stress chamber 50 includes a thermally insulated hot chamber 53 and a thermally insulated cold chamber 52 defined by a thermally insulated housing 51. The thermal stress fixtures 100 are placed in a chamber 60 of a movable carriage 55 which can be rapidly moved back and forth between a lower cold chamber 52 and an upper hot chamber 53 in order to subject WSP chips within the thermal stress fixtures 100 to thermal stress cycles having the temperature profile shown in FIG. 4. Access to cold chamber 52 is through a movable, thermally insulated door 57, and access to hot chamber 53 is through a movable, thermally insulated door 56. View ports 56A and 57A are provided in doors 56 and 57, respectively. Movable carriage 55 moves up and down as indicated by arrows 77 in response to a pneumatic cylinder 74 controlled by a controller 44. Pneumatic cylinder 74 includes a vertically movable piston 73 that moves up and down as indicated by arrows 76. A cable 70 has one end connected to the top of movable carriage 55. Cable 70 passes over idler pulleys 71 and 72, and its second end is connected to the upper end of piston 73. Air flow control is controlled by controller 44 to adjust the amount of liquid nitrogen that flows through refrigeration elements 58 to maintain a preset cold temperature in cold chamber 52 in response to a thermal sensor (not shown) in cold chamber 52. A controller 44 controls the amount of power delivered to heating elements 54 in hot chamber 53 to maintain a preset hot temperature in hot chamber 53 in response to a thermal sensor (not shown) in hot chamber 53. A number of the thermal stress fixtures 100 loaded with chips 10 are manually placed on a shelf 61 in chamber 60 of movable carriage 55.

The top 55A of movable carriage 55 includes a peripheral lip 64 that engages a corresponding surface of a ledge 62,68 to form a "door" that maintains a thermal seal between hot chamber 53 and cold chamber 52 when movable carriage 55 is lowered all the way into cold chamber 52. Similarly, the bottom 55B of movable carriage 55 includes a peripheral lip 66 that engages a corresponding surface of ledge 62,68 to form another door that maintains a thermal seal between hot chamber 53 and cold chamber 52 when movable carriage 55 is raised all the way into hot chamber 53. The ramping times that the thermal stress fixtures and the WSP chips therein experience is a function of the thermal mass and other properties of the two chambers 52 and 53. The controller 44 can cause movable carried 55 to move from one chamber to the other hand seal the two chambers from each other in approximately 7 seconds. There is a small fan (not shown) in each chamber that keeps the thermal medium, such as nitrogen, moving so that it flows through the thermal stress fixtures 100 and provides rapid three minute ramping times between the temperature extremes that are preset as inputs to controller 44. Thermal stress chamber 50 is commercially available from Blue M Corporation.

Figure 1:
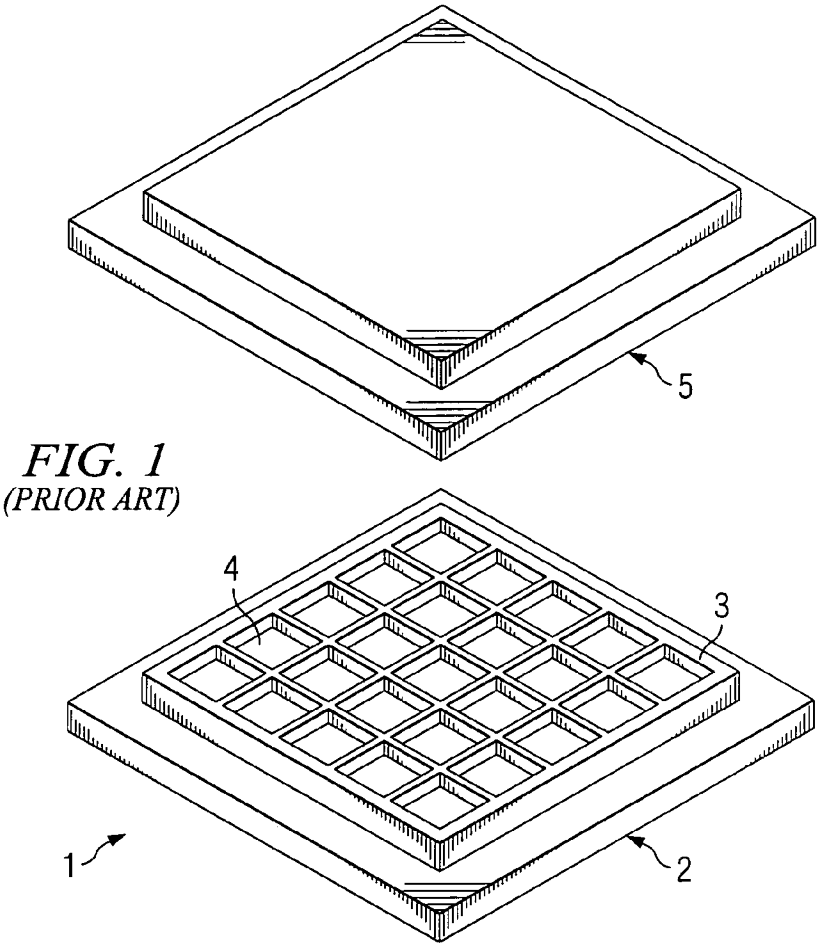
Figure 4:
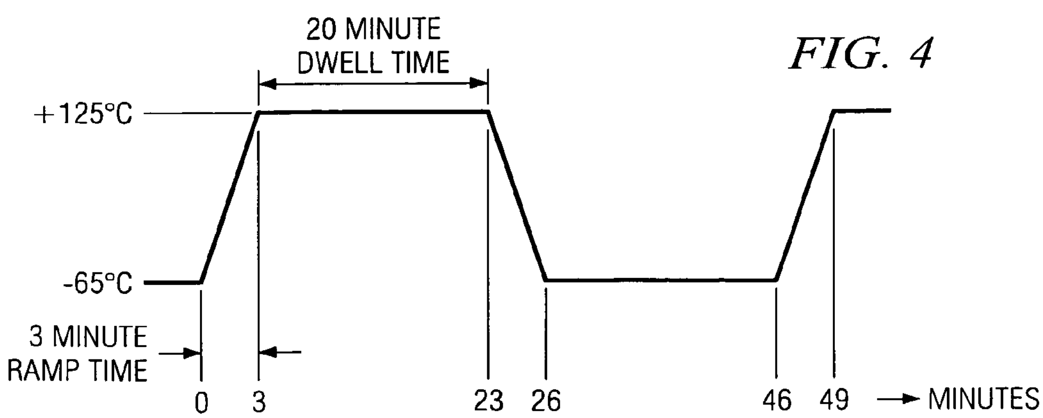
FIG. 4 is a diagram illustrating a thermal cycle produced by the thermal testing chamber of FIG. 3.

Thermal stress chamber 50 includes a controller 44 that allows the upper temperature, the lower temperature, and the number of cycles to be manually set. FIG. 4 shows the profile of a typical thermal stress cycle produced by thermal stress chamber 50 of FIG. 3, wherein the lower temperature is −65 degrees Celsius, the upper temperature is +125 or +150 degrees Celsius, and the number of cycles is typically between 500 and 1000. The profile of a typical thermal stress cycle, shown in FIG. 4, begins at −65 degrees Celsius, and ramps up to +125 degrees Celsius in three minutes, remains at +125 degrees Celsius for a "dwell time" of approximately 20 minutes, and then ramps down to −65 degrees Celsius in three minutes, and remains at that temperature for a dwell time of 20 minutes.

The structure of the described embodiment of the invention is relatively simple and is easily fabricated using readily available materials. No complex machining/forming operations are required, nor is any special tooling required in order to produce the described WSP chip support fixture. The low thermal mass and rapid thermal transfer characteristics of the described fixtures result in short temperature ramp-up and temperature ramp-down times. Furthermore, by varying the depths and/or diameters of the cavities 24, various WSP chips can be thermally tested and/or thermally cycled using the same fixturing equipment, including support fixtures, chip loading/unloading equipment, etc.

Thus, the invention provides a simple, economical way to restrain and protect small chips, chip-scale devices, and the like under test conditions during thermal cycling in either or both gas and liquid thermal test mediums. The invention provides minimal restriction of the thermal fluid medium flow around the WSP chips, thereby enhancing the thermal transfer process due to lack of restriction by providing rapid, thermal transfer between the WSP chips and the medium, and also provides a substantial reduction in the thermal mass of the fixture which allows rapid thermal ramp-up and ramp-down times.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, a the thermal stress fixture 100 of the present invention might be used in a commercially available "purge and surge" single thermal chamber system instead of the system shown in FIG. 3 in order to subject the WSP chips to a temperature cycling profile similar to that shown in FIG. 4.

What is claimed is:

1. A fixture for supporting a plurality of semiconductor chips during the thermal cycling of the chips, comprising:
- (a) a fluid-permeable bottom screen;
- (b) a chip-cavity-defining plate disposed against a top surface of the bottom screen, the chip-cavity-defining plate having a plurality of holes therein;
- (c) a fluid-permeable top screen; and
- (e) a removable mounting flange attached to a bottom surface of the top screen for holding the top screen against a top surface of the chip-cavity-defining-plate to cover the plurality of holes and chips therein, the top screen, bottom screen and the plurality of holes in the chip-cavity-defining plate forming a plurality of cavities for containing a plurality of semiconductor chips, respectively.

2. The fixture of claim 1 including means for attaching a bottom surface of the chip-cavity-defining plate to the top surface of the bottom screen.

3. The fixture of claim 2 wherein the bottom surface attaching means includes adhesive material.

4. The fixture of claim 2 wherein the bottom screen is composed of pre-tensioned screen material.

5. The fixture of claim 2 including a plurality of screws extending past the bottom screen and the chip-cavity-defining plate through the mounting flange and the top screen for holding the top screen against the top surface of the chip-cavity-defining plate.

6. The fixture of claim 2 wherein the mounting flange is composed of aluminum of the same thickness as the chip-cavity-defining plate.

7. The fixture of claim 1 including means for attaching a top surface of the mounting flange to a bottom surface of the top screen.

8. The fixture of claim 7 wherein the top surface attaching means includes adhesive material.

9. The fixture of claim 7 wherein the top screen is composed of pre-tensioned screen material.

10. The fixture of claim 1 wherein the holes are circular.

11. The fixture of claim 1 wherein the top screen and the bottom screen are composed of stainless steel mesh.

12. The fixture of claim 11 wherein the top screen and the bottom screen are composed of 325 Mesh stainless steel.

13. The fixture of claim 1 wherein the chip-cavity-defining plate is composed of aluminum.

14. The fixture of claim 1 wherein the thickness of the chip-cavity-defining plate is approximately 40 mils.

15. A method of thermally cycling semiconductor chips, comprising:
- (a) supporting a plurality of semiconductor chips during thermal cycling of the chips, by providing a fixture having low thermal mass, the fixture including a fluid-permeable bottom screen, a chip-cavity-defining plate supported against a top surface of the bottom screen, the chip-cavity-defining plate having a plurality of holes therein, and a removable fluid-permeable top screen;
- (b) placing the semiconductor chips in various cavities defined by the holes in the bottom screen and the chip-cavity-defining plate;
- (c) attaching the top screen to a top surface of the chip-cavity-defining plate to cover the cavities and the chips therein;
- (d) a supporting the fixture with the chips therein in a thermal cycling device; and
- (e) thermally cycling the semiconductor chips by passing a fluid thermal medium of a predetermined temperature through the top screen, around the semiconductor chips, and through the bottom screen.

16. The method of claim 15 including providing a mounting flange between the bottom surface of the top screen and the top surface of the bottom screen.

17. The method of claim 16 including forming the top screen and the bottom spacer of stainless steel mesh.

18. The method of claim 16 including forming the chip-cavity-defining plate and the mounting flange of aluminum.

19. A method of making a fixture for supporting a plurality of semiconductor chips during the thermal cycling of the chips, comprising:
- (a) adhesively attaching a bottom surface of a chip-cavity-defining plate to a surface of a taut pre-tensioned fluid-permeable screen material, the chip-cavity-defining plate having a plurality of holes therein to form a bottom subassembly into cavities of which the semiconductor chips can be respectively placed; and
- (b) adhesively attaching a top surface of a mounting flange to a surface of a taut pre-tensioned fluid-permeable screen material to form a top subassembly which can be aligned with and attached to the bottom subassembly to provide a cover over the cavities during the thermal cycling.

20. The method of claim 19 wherein step (a) includes adhesively attaching bottom surfaces of a plurality of chip-cavity-defining plates to a surface of taut pre-tensioned fluid-permeable screen material tightly stretched over a frame.

21. The method of claim 19 wherein step (b) includes adhesively attaching top surfaces of a plurality of mounting flanges to a surface of a taut pre-tensioned fluid-permeable screen material tightly stretched over a frame.

22. The method of claim 19 wherein the adhesive attaching is performed by means of glue and thermally curing the glue.

23. The method of claim 19 including providing a plurality of screws extending past the bottom screen and the chip-cavity-defining plate through the mounting flange and the top screen for holding the top screen against the top surface of the chip-cavity-defining plate.

24. The method of claim 19 wherein the top screen and the bottom screen are composed of pre-tensioned 325 Mesh stainless steel.

* * * * *